(12) United States Patent
Priewasser et al.

(10) Patent No.: US 10,242,913 B2
(45) Date of Patent: *Mar. 26, 2019

(54) METHOD OF PROCESSING A WAFER AND WAFER PROCESSING SYSTEM

(71) Applicant: DISCO Corporation, Tokyo (JP)

(72) Inventors: Karl Heinz Priewasser, Munich (DE); Hitoshi Hoshino, Munich (DE)

(73) Assignee: DISCO Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/879,115

(22) Filed: Jan. 24, 2018

(65) Prior Publication Data

US 2018/0211877 A1 Jul. 26, 2018

(30) Foreign Application Priority Data

Jan. 25, 2017 (DE) .......................... 10 2017 201 154

(51) Int. Cl.
*H01L 21/00* (2006.01)
*H01L 21/78* (2006.01)
*H01L 21/683* (2006.01)

(52) U.S. Cl.
CPC .......... *H01L 21/78* (2013.01); *H01L 21/6836* (2013.01); *H01L 2221/68336* (2013.01)

(58) Field of Classification Search
CPC ................. H01L 21/78; H01L 21/6836; H01L 2221/68336
See application file for complete search history.

(56) References Cited

U.S. PATENT DOCUMENTS 9,935,010 B2 * 4/2018 Priewasser ........... B23K 26/364
2007/0057378 A1 3/2007 Arai et al.
(Continued)

FOREIGN PATENT DOCUMENTS

DE 102010046665 A1 4/2011
JP 03078242 A 4/1991
(Continued)

OTHER PUBLICATIONS

Official action issued in in German App. No. DE 10 2017 201 154.8, dated Oct. 19, 2017.
(Continued)

*Primary Examiner* — Laura M Menz
(74) *Attorney, Agent, or Firm* — Greer Burns & Crain Ltd.

(57) ABSTRACT

A method of processing a wafer having a plurality of devices partitioned by division lines, including attaching the wafer to an adhesive tape supported by a first annular frame, dividing the wafer along the division lines into a plurality of dies, and placing the wafer (and the adhesive tape) on a support surface of a support member before or after dividing the wafer, wherein an outer diameter of the support member in the plane of the support surface is smaller than an inner diameter of the first annular frame. The method also includes moving the first annular frame and at least a peripheral part of the support member relative to each other to radially expand the adhesive tape, thereby moving the dies away from each other, and attaching a second annular frame to a portion of the expanded adhesive tape arranged at the peripheral part of the support member.

14 Claims, 4 Drawing Sheets

(56) References Cited

U.S. PATENT DOCUMENTS

| | | |
|---|---|---|
| 2011/0050047 A1 | 3/2011 | Numata |
| 2011/0138857 A1 | 6/2011 | Numata et al. |
| 2012/0100694 A1 | 4/2012 | Kajiyama et al. |
| 2013/0230973 A1 | 9/2013 | Gauldin et al. |
| 2014/0339673 A1 | 11/2014 | Shoichi et al. |
| 2015/0348821 A1 | 12/2015 | Iwanaga et al. |
| 2015/0364375 A1 | 12/2015 | Nakamura et al. |

FOREIGN PATENT DOCUMENTS

| | | |
|---|---|---|
| JP | 2002093752 A | 3/2002 |
| JP | 2007173587 A | 7/2007 |
| JP | 2013051368 A | 3/2013 |
| JP | 2015133442 A | 7/2015 |

OTHER PUBLICATIONS

Examination report issued in German Patent App. No. 10 2016211 044 dated Mar. 2, 2017.

* cited by examiner

METHOD OF PROCESSING A WAFER AND WAFER PROCESSING SYSTEM

TECHNICAL FIELD

The present invention relates to a method of processing a wafer, having on one side a device area with a plurality of devices partitioned by a plurality of division lines. Further, the invention relates to a wafer processing system for carrying out this method.

TECHNICAL BACKGROUND

In a semiconductor device fabrication process, a wafer having a device area with a plurality of devices partitioned by a plurality of division lines is divided into individual dies or chips along the division lines.

Substantially the same approach as detailed above is also adopted to obtain, for example, individual power devices, optical devices, medical devices, electrical components or MEMS devices from wafers with device areas, in which these devices are formed.

In order to reduce the strength of the wafer along the division lines prior to dividing the wafer, it is known to form a modified region in the wafer along the division lines. This modified region may be in the form of a modified layer formed inside the wafer or in the form of a plurality of hole regions, wherein each hole region is composed of an amorphous region and a space in the amorphous region open to at least one surface of the wafer. Such a modified region is formed by applying a laser beam with a suitable wavelength to the wafer along the division lines.

After the modified region has been formed in the wafer along the division lines, an external force is applied to the wafer in the radial directions thereof, thereby dividing the wafer along the division lines and separating the resulting dies or chips from each other. In particular, the wafer may be attached to an expandable tape and the external force may be applied thereto by radially expanding the tape.

Alternatively, the wafer may be divided along the division lines into the individual dies or chips, for example, by mechanical cutting, laser cutting or applying a plasma to the wafer. Prior to this dividing process, the wafer may be attached to a tape, such as an adhesive tape.

Subsequently, after dividing the wafer into the individual dies or chips, the separated dies or chips may be picked up from the tape. Alternatively, the dies or chips are kept on the tape and, in this state, subjected to further processing, stored or shipped. When keeping the separated dies or chips attached to the tape, it is important to maintain radial tension of the tape, in order to prevent damage to the dies or chips due to any unintentional contact therebetween.

DE 10 2010 046 665 A1 discloses a method of processing a wafer in which, after separating dies from each other by radially expanding an expandable tape, a ring-shaped tape is attached to a peripheral portion of the expanded tape, so as to keep the expanded tape under radial tension. The ring-shaped tape is supported by an annular frame.

However, the approach taught in DE 10 2010 046 665 A1 requires the preparation of an annular frame with a suitably adapted ring-shaped tape attached thereto and is thus laborious and time-consuming. Since the tape has to be cut into an appropriate ring shape, there are significant material losses, resulting in increased processing costs. Also, the characteristics of the ring-shaped tape have to be precisely matched with those of the expandable tape, thus restricting the choice of possible tape materials. Further, the tension of the ring-shaped tape may decrease over time, creating the risk of unintentional contact between the dies, e.g., during storage or shipping thereof.

Hence, there remains a need for a method of processing a wafer and a wafer processing system which allow for the wafer to be processed in an efficient, reliable and cost-efficient manner.

SUMMARY OF THE INVENTION

Accordingly, it is an object of the present invention to provide a method of processing a wafer and a wafer processing system which allow for the wafer to be processed in an efficient, reliable and cost-efficient manner. This goal is achieved by a wafer processing method with the technical features of claim 1 and a wafer processing system with the technical features of claim 13. Preferred embodiments of the invention follow from the dependent claims.

The invention provides a method of processing a wafer, having on one side a device area with a plurality of devices partitioned by a plurality of division lines. The method comprises attaching the one side of the wafer or the side of the wafer opposite to the one side to an adhesive tape supported by a first annular frame, so that the wafer is arranged within a central opening of the first annular frame, dividing the wafer along the division lines into a plurality of dies or chips, and placing the wafer attached to the adhesive tape on a support surface of a support member before or after dividing the wafer, so that the side of the adhesive tape opposite to the side thereof which is attached to the wafer is in contact with the support surface. An outer diameter of the support member in the plane of the support surface is smaller than an inner diameter of the first annular frame. The adhesive tape is an expandable adhesive tape. The method further comprises, after dividing the wafer, moving the first annular frame and at least a peripheral part of the support member relative to each other in the direction perpendicular to the plane of the support surface, so as to radially expand the adhesive tape in the directions lying in the plane of the support surface, thereby moving the dies or chips away from each other, and attaching a second annular frame to a portion of the expanded adhesive tape arranged at the peripheral part of the support member. The second annular frame is attached to the side of the adhesive tape which is attached to the wafer and the wafer, which has been divided into the plurality of dies or chips, is arranged within a central opening of the second annular frame. An inner diameter of the second annular frame is smaller than the outer diameter of the support member in the plane of the support surface and smaller than the inner diameter of the first annular frame.

Herein, the expression "outer diameter of the support member in the plane of the support surface" defines the outer diameter of the support member in the radial directions of the support member.

According to the processing method of the invention, the second annular frame is attached to the portion of the expanded adhesive tape arranged at the peripheral part of the support member, with the wafer, which has been divided into the plurality of dies or chips, being arranged within the central opening of the second annular frame. The inner diameter of the second annular frame is smaller than the outer diameter of the support member in the plane of the support surface and smaller than the inner diameter of the first annular frame.

Hence, the second annular frame can be attached to the peripheral portion of the expanded adhesive tape in a simple manner, reliably maintaining radial tension of the tape and thus preventing any damage to the dies or chips due to an unintentional contact therebetween.

Since no additional tape has to be prepared for keeping the expanded adhesive tape under tension, the efficiency of the processing method is significantly improved. Further, no material losses occur, so that the processing costs are minimised. Moreover, due to the use of the second annular frame which is attached directly to the peripheral portion of the expanded adhesive tape, the tension applied to the expanded tape can be reliably maintained over an extended period of time.

Therefore, the processing method of the invention allows for the wafer to be processed in an efficient, reliable and cost-efficient manner.

The wafer may be divided along the division lines into the plurality of dies or chips, for example, by mechanical cutting or dicing and/or laser cutting or dicing and/or plasma cutting or dicing.

The wafer may be divided along the division lines into the plurality of dies or chips in a single mechanical cutting or dicing step, e.g., by blade dicing or sawing, or in a single laser cutting or dicing step, e.g., by laser ablation, or in a single plasma cutting or dicing step, e.g., by using a plasma source.

The wafer may be divided along the division lines into the plurality of dies or chips by a sequence of mechanical cutting or dicing and/or laser cutting or dicing and/or plasma cutting or dicing steps. For example, a mechanical cutting or dicing step may be followed by a laser cutting or dicing step or by a plasma cutting or dicing step. Alternatively, a laser cutting or dicing step may be followed by a plasma cutting or dicing step.

The process of dividing the wafer along the division lines into the plurality of dies or chips may be performed from the side of the wafer which is opposite to the side of the wafer attached to the adhesive tape. The process of dividing the wafer along the division lines into the plurality of dies or chips thus may be performed from the exposed side of the wafer.

For example, in the process of dividing the wafer along the division lines into the plurality of dies or chips, a mechanical cutting or dicing means, such as a blade or a saw, and/or a laser beam and/or a plasma may be applied to the exposed side of the wafer.

In a particularly preferred embodiment, the wafer is divided along the division lines into the plurality of separate dies or chips by applying a plasma to the wafer. In this case, the wafer is fully divided in the plasma applying step. For example, the wafer may be cut by plasma dicing.

Dividing the wafer into the separate dies or chips by applying a plasma thereto allows for narrow kerfs or cutting grooves to be formed between the dies or chips. In particular, the kerfs or cutting grooves obtained in this way are considerably narrower than those achievable by conventional blade dicing processes. Thus, the number of dies or chips obtainable from a single wafer can be significantly increased.

Moreover, the side walls of the resulting dies or chips can be plasma etched in the plasma applying step. No mechanical dicing stress is imparted to the dies or chips in the division process. Hence, the die strength of the dies or chips is enhanced.

Also, in particular, for the case of small die sizes, the plasma division process is considerably faster than conventional blade or laser dicing approaches, thus further improving efficiency of the processing method. For example, the plasma division process allows for all division lines to be etched in a single pass.

After dividing the wafer, e.g., by applying a plasma thereto, the first annular frame and at least a peripheral part of the support member are moved relative to each other in the direction perpendicular to the plane of the support surface, so as to radially expand the adhesive tape in the directions lying in the plane of the support surface. Thus, the dies or chips are moved away from each other in the radial directions of the wafer, i.e., in the directions lying in the plane of the support surface. In this way, the distances between the dies or chips are increased. By attaching the second annular frame to the peripheral portion of the expanded adhesive tape, the dies or chips are reliably kept in their spaced positions, thus preventing any damage to the dies or chips due to an unintentional contact therebetween.

The process of dividing the wafer along the division lines into the plurality of dies or chips may be performed from the one side of the wafer or from the side of the wafer opposite to the one side.

For example, in the process of dividing the wafer along the division lines into the plurality of dies or chips, a mechanical cutting or dicing means, such as a blade or a saw, and/or a laser beam and/or a plasma may be applied to the one side of the wafer or to the side of the wafer opposite to the one side.

The one side of the wafer, i.e., the front side of the wafer on which the device area is formed, may be attached to the adhesive tape supported by the first annular frame. In this case, the mechanical cutting or dicing means and/or the laser beam and/or the plasma can be applied to the side of the wafer opposite to the one side, i.e., the back side of the wafer, in a particularly simple manner.

Alternatively, the back side of the wafer may be attached to the adhesive tape supported by the first annular frame. In this case, the mechanical cutting or dicing means and/or the laser beam and/or the plasma can be applied to the front side of the wafer in a particularly simple manner.

The choice of which side of the wafer is attached to the adhesive tape may be made dependent on the material and/or condition of the wafer.

As has been detailed above, if the wafer is divided by applying a plasma thereto, the plasma may be applied to the side of the wafer which is opposite to the side of the wafer attached to the adhesive tape. Thus, the plasma may be applied to the exposed side of the wafer.

The processing method of the invention may further comprise a grinding step for adjusting the wafer thickness. The grinding step may be performed from the back side of the wafer which is opposite to the wafer front side on which the device area is formed. The grinding step may be carried out before or after dividing the wafer along the division lines into the plurality of dies.

The wafer may be, for example, a semiconductor wafer, a glass wafer, a sapphire wafer, a ceramic wafer, such as an alumina ($Al_2O_3$) ceramic wafer, a silicon oxide ($SiO_2$) wafer, an aluminium nitride (AlN) wafer or the like.

In particular, the wafer may be, for example, a silicon (Si) wafer, a gallium arsenide (GaAs) wafer, a gallium nitride (GaN) wafer, a gallium phosphide (GaP) wafer, an indium arsenide (InAs) wafer, an indium phosphide (InP) wafer, a silicon carbide (SiC) wafer, a silicon nitride (SiN) wafer, a lithium tantalate (LT) wafer, a lithium niobate (LN) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The wafer may be a semiconductor-sized wafer. Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 3 inch, 4 inch, 5 inch, 6 inch, 8 inch, 12 inch or 18 inch wafer.

The devices formed in the device area on the front side of the wafer may be, for example, semiconductor devices, power devices, optical devices, medical devices, electrical components, MEMS devices or combinations thereof.

When radially expanding the adhesive tape in the directions lying in the plane of the support surface, thereby moving the dies away from each other, the side of the wafer which is not attached to the adhesive tape may be arranged so as to face upwards or downwards, i.e., upwards or downwards in the direction of gravity. If the side of the wafer which is not attached to the adhesive tape is oriented downwards, it can be particularly reliably ensured that any particles, such as debris, generated during wafer separation are prevented from adhering to surfaces of the dies.

The first and second annular frames are rigid frames. The first and/or the second annular frame may be made of a metal or a plastic material, such as a polymer.

The first and/or the second annular frame may have a thickness of at least 2 mm, preferably at least 3 mm and more preferably at least 4 mm. The first and/or the second annular frame may have a thickness in the range of 2 mm to 12 mm, preferably in the range of 3 mm to 10 mm and more preferably in the range of 4 mm to 8 mm.

The adhesive tape may comprise a base layer and an adhesive layer applied to the base layer. The base layer may be made of a polymer material, such as polyvinyl chloride (PVC), ethylene vinyl acetate (EVA) or polyolefin.

In one embodiment, the wafer attached to the adhesive tape is placed on the support surface of the support member before dividing the wafer, and the wafer placed on the support surface is divided along the division lines into the plurality of dies. In this case, the same support member can be used for holding the wafer during the step of dividing the wafer and for radially expanding the adhesive tape, thus further increasing the processing efficiency.

In another embodiment, the wafer attached to the adhesive tape is placed on the support surface of the support member after dividing the wafer. This approach offers a particularly high degree of flexibility. For example, in this case, a single support member may be used for, i.e., in combination with, a plurality of, e.g., two or three, dividing means, such as mechanical cutting or dicing means, laser beam applying means or plasma applying means, thus significantly reducing the equipment costs.

A further process, such as a cleaning process, or further processes may be performed on the wafer placed on the support surface, e.g., before and/or after radially expanding the adhesive tape. In this case, the same support member can be used for holding the wafer during the further process or processes and for radially expanding the adhesive tape, thus further increasing the processing efficiency.

The support member may be in the form of a support table, e.g., having a circular cross-section in the plane of the support surface. For example, the support member may be a chuck table. The support member may have a continuous support surface.

When the wafer attached to the adhesive tape is placed on the support surface of the support member, at least a portion of the wafer attached to the adhesive tape may rest, i.e., rest directly, on the support surface. The entire wafer attached to the adhesive tape may rest, i.e., rest directly, on the support surface.

The support member may have a substantially annular cross-section or an annular cross-section in the plane of the support surface. For example, the support member may be a hollow expansion drum. The support member may have a discontinuous support surface.

When the wafer attached to the adhesive tape is placed on the support surface of the support member, the wafer may be held on the support surface through the adhesive tape. No portion of the wafer attached to the adhesive tape may rest directly on the support surface.

The first annular frame and the entire support member, e.g., a support table or a support member with substantially annular or annular cross-section, may be moved relative to each other in the direction perpendicular to the plane of the support surface, so as to radially expand the adhesive tape in the directions lying in the plane of the support surface, thereby moving the dies away from each other.

The relative movement between first annular frame and support member may be effected by moving only the first annular frame and keeping the support member stationary, by moving only the support member and keeping the first annular frame stationary, or by moving the first annular frame and the support member relative to each other in opposite directions. The support member may comprise a central part and a substantially annular or annular peripheral part surrounding the central part.

The central part may be in the form of a support table, e.g., having a circular cross-section in the plane of the support surface. For example, the central part may be in the form of a chuck table. The central part may have a continuous support surface.

The peripheral part has a substantially annular cross-section or an annular cross-section in the plane of the support surface. For example, the peripheral part may be in the form of a hollow expansion drum. The peripheral part has a discontinuous support surface.

The peripheral part of the support member may be movable relative to the central part of the support member in the direction perpendicular to the plane of the support surface. The first annular frame and the peripheral part of the support member may be moved relative to each other in the direction perpendicular to the plane of the support surface, so as to radially expand the adhesive tape in the directions lying in the plane of the support surface, thereby moving the dies away from each other. Only the peripheral part of the support member and the first annular frame may be moved relative to each other. The central part of the support member may be kept stationary.

The processing method of the invention may further comprise, after attaching the second annular frame to the expanded adhesive tape, circumferentially cutting the adhesive tape in a position arranged outside, i.e., radially outside, the portion of the adhesive tape which is attached to the second annular frame. In this way, the portion of the adhesive tape attached to the second annular frame can be separated from the remainder of the tape in a simple and efficient manner, allowing for the second annular frame and the divided wafer attached thereto through the adhesive tape to be removed from the wafer processing system. Subsequently, the divided wafer supported by the second annular frame may be, for example, subjected to further processing, stored or shipped.

The support member, e.g., in the form of a support table, such as a chuck table, may have a chamfered or tapered peripheral portion, so that the diameter of the support member decreases with increasing distance from the support surface in the direction perpendicular to the plane of the support surface. Such a chamfered or tapered peripheral portion allows for a particularly good access to the adhesive tape for a cutting tool used in cutting the adhesive tape. Hence, in this case, the cutting process can be carried out in a particularly efficient and accurate manner.

The processing method of the invention may further comprise, after cutting the adhesive tape, attaching to the second annular frame a portion of the adhesive tape which is arranged between the position where the adhesive tape had been cut and the portion of the adhesive tape which is attached to the second annular frame. In this way, it can be reliably prevented that a portion of the adhesive tape may be separated, e.g., peeled off, from the second annular frame. Thus, a particularly stable and reliable fixation of the adhesive tape to the second annular frame can be ensured.

The portion of the adhesive tape which is arranged between the position where the adhesive tape had been cut and the portion of the adhesive tape which is attached to the second annular frame may be attached to the second annular frame, e.g., by using a roller or a plurality, such as a pair, of rollers. For example, the roller or the plurality of rollers may be moved circumferentially along the portion of the adhesive tape which is to be attached to the second annular frame, pressing the portion of the adhesive tape against the second annular frame, thereby attaching these two components to each other.

The processing method of the invention may further comprise, e.g., before cutting the adhesive tape, applying pressure to the portion of the expanded adhesive tape attached to the second annular frame, for example, by using a roller or a plurality, such as a pair, of rollers. For example, the roller or the plurality of rollers may be moved circumferentially along the portion of the adhesive tape which is attached to the second annular frame, pressing the portion of the adhesive tape against the second annular frame. In this way, a particularly stable and reliable fixation of the adhesive tape to the second annular frame can be ensured.

The inner diameter of the second annular frame may be smaller than the outer diameter of the support member in the plane of the support surface and/or smaller than the inner diameter of the first annular frame by 20 mm or more, preferably by 30 mm or more. Thereby, it can be ensured in a simple and efficient manner that the portion of the adhesive tape which is attached to the second annular frame is an annular tape portion with a ring width of at least 10 mm, preferably at least 15 mm. Herein, the term "ring width" defines half the difference between an outer diameter of an annular element and an inner diameter thereof, i.e., outer diameter minus inner diameter divided by two.

In this way, a particularly reliable and stable connection between the adhesive tape and the second annular frame is achieved.

The first annular frame and the second annular frame may have the same ring width. The first annular frame may have a ring width which is smaller than the ring width of the second annular frame. The first annular frame may have a ring width which is larger than the ring width of the second annular frame.

The first and/or the second annular frame may have a ring width in the range of 20 mm to 70 mm, preferably in the range of 30 mm to 60 mm and more preferably in the range of 40 mm to 50 mm.

The first and second frames are annular frames. Herein, the term "annular" encompasses shapes which deviate from a perfect annulus, e.g., due to the presence of one or more flat or straight portions, notches and/or grooves, e.g., at the outer and/or inner circumference of the annulus. The first and/or the second annular frame may have a minimum ring width, e.g., at a position of the annulus where a flat or straight portion, a notch or a groove is present, in the range of 20 mm to 70 mm, preferably in the range of 30 mm to 60 mm and more preferably in the range of 40 mm to 50 mm.

The outer diameter of the first annular frame may be substantially the same as the outer diameter of the second annular frame. In this way, a particularly efficient and space saving arrangement can be provided, since first and second frame holding means for holding the first and second annular frames, respectively, can be chosen so as to have substantially the same size.

The outer diameter of the first annular frame may be larger than the outer diameter of the second annular frame. The outer diameter of the first annular frame may be smaller than the outer diameter of the second annular frame.

The second annular frame may be a semiconductor-sized annular frame. Herein, the term "semiconductor-sized annular frame" refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are also defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 3 inch, 4 inch, 5 inch, 6 inch, 8 inch, 12 inch or 18 inch.

By providing a semiconductor-sized annular frame as the second annular frame, further processing of the wafer after it has been divided, e.g., further processing after storage or shipping thereof, is facilitated. In particular, by choosing a semiconductor-sized annular frame, compatibility of the unit formed by wafer, adhesive tape and second annular frame with common semiconductor wafer processing equipment, e.g., at a facility different from that where the division of the wafer had been carried out, is ensured.

As has been detailed above, dividing the wafer along the division lines into the plurality of dies may comprise applying a plasma to the wafer. The wafer may be divided along the division lines into the plurality of dies by applying a plasma to the wafer.

The plasma may be applied to the wafer using a plasma applying means, such as a plasma chamber, a plasma source, a plasma torch or a plasma nozzle.

In some embodiments, the plasma may be applied directly to the wafer, i.e., without employing a mask, by means of a plasma beam, for example, using a plasma torch or a plasma nozzle.

In other embodiments, the method may further comprise forming a mask on the side of the wafer opposite to the side thereof which is attached or to be attached to the adhesive tape, after or before attaching the wafer to the adhesive tape and before applying the plasma to the wafer.

The mask may be formed on the one side of the wafer or on the side of the wafer opposite to the one side.

The mask may be formed so as to leave uncovered the division lines on the one side of the wafer, if the mask is formed on the one side of the wafer, or to leave uncovered the regions of the side of the wafer opposite to the one side which lie opposite the division lines, if the mask is formed on the side of the wafer opposite to the one side. The mask may be formed so as to substantially cover the entire respective wafer surface but to leave uncovered only the division lines on the one side of the wafer or only the regions of the side of the wafer opposite to the one side which lie opposite the division lines.

Forming the mask on the side of the wafer opposite to the side thereof which is attached or to be attached to the adhesive tape may include applying a cover layer, such as a resist layer, to this side of the wafer and patterning the cover layer, e.g., by optical lithography or electron beam lithography. For example, the cover layer may be patterned by photolithography or lithography using a laser beam.

The plasma may be applied to the wafer on which the mask has been formed. For example, the wafer having the mask formed thereon may be placed in a plasma chamber and subjected to plasma etching. In this case, the plasma will react with the wafer material only in those areas of the wafer which are not covered by the mask, e.g., the division lines on the one side of the wafer or the regions of the side of the wafer opposite to the one side which lie opposite the division lines. The plasma will remove the wafer material in these areas by plasma etching, thus dividing the wafer along the division lines into the individual dies or chips.

Subsequently, the mask may be removed from the separated dies or chips.

The invention further provides a wafer processing system for processing a wafer, having on one side a device area with a plurality of devices partitioned by a plurality of division lines. The system comprises a support member having a support surface for placing the wafer thereon, a first frame holding means for holding a first annular frame, a dividing means for dividing the wafer along the division lines into a plurality of dies or chips, and a second frame holding means for holding a semiconductor-sized second annular frame. The support member and the first frame holding means are configured so that the first frame holding means and at least a peripheral part of the support member are movable relative to each other in the direction perpendicular to the plane of the support surface. The support member and the second frame holding means are configured so that the second frame holding means and at least the peripheral part of the support member are movable relative to each other in the direction perpendicular to the plane of the support surface. An outer diameter of the support member in the plane of the support surface is larger than an inner diameter of the semiconductor-sized second annular frame.

The wafer processing system of the invention is a system configured for carrying out the wafer processing method of the invention. The wafer processing system thus provides the technical effects and advantages already described in detail above for the wafer processing method.

The features described above for the wafer processing method of the invention also apply to the wafer processing system of the invention. In particular, the support member of the wafer processing system has been described in detail above.

By moving the first frame holding means and at least a peripheral part of the support member relative to each other in the direction perpendicular to the plane of the support surface, an adhesive tape supported by the first annular frame is radially expanded in the directions lying in the plane of the support surface by the support member, thereby moving the dies attached to the adhesive tape away from each other.

By moving the second frame holding means and at least the peripheral part of the support member relative to each other in the direction perpendicular to the plane of the support surface, the semiconductor-sized second annular frame is attached to a portion of the expanded adhesive tape arranged at the peripheral part of the support member.

The dividing means may be configured for dividing the wafer placed on the support surface of the support member.

The dividing means may be a mechanical cutting or dicing means, a laser beam applying means or a plasma applying means. The dividing means may comprise one or more mechanical cutting or dicing means and/or one or more laser beam applying means and/or one or more plasma applying means. For example, the dividing means may comprise a mechanical cutting or dicing means and a laser beam applying means or a plasma applying means. The dividing means may comprise a laser beam applying means and a plasma applying means.

The mechanical cutting or dicing means may be configured for mechanically cutting or dicing the wafer placed on the support surface of the support member.

The laser beam applying means may be configured for applying a laser beam to the wafer placed on the support surface of the support member.

The plasma applying means may be configured for applying a plasma to the wafer placed on the support surface of the support member.

The mechanical cutting or dicing means may be, for example, a blade or a saw. The plasma applying means may be, for example, a plasma chamber, a plasma source, a plasma torch or a plasma nozzle.

The wafer processing system may further comprise a first moving means for moving the first frame holding means and at least a peripheral part of the support member relative to each other in the direction perpendicular to the plane of the support surface.

The wafer processing system may further comprise a second moving means for moving the second frame holding means and at least the peripheral part of the support member relative to each other in the direction perpendicular to the plane of the support surface.

The wafer processing system may further comprise a tape cutting means for cutting the adhesive tape supported by the first annular frame. The tape cutting means may be configured for circumferentially cutting the adhesive tape in a position arranged outside, i.e., radially outside, the portion of the adhesive tape which is attached to the second annular frame.

The wafer processing system may further comprise a pressing means for applying pressure to a portion of the adhesive tape. For example, the pressing means may comprise a roller or a plurality, such as a pair, of rollers.

The pressing means may be configured for, after cutting the adhesive tape, attaching to the second annular frame a portion of the adhesive tape which is arranged between the position where the adhesive tape had been cut and the portion of the adhesive tape which is attached to the second annular frame. For example, the roller or the plurality of rollers of the pressing means may be moved circumferentially along the portion of the adhesive tape which is to be attached to the second annular frame, pressing the portion of the adhesive tape against the second annular frame, thereby attaching these two components to each other.

The pressing means may be configured for, e.g., before cutting the adhesive tape, applying pressure to the portion of the expanded adhesive tape attached to the second annular frame. For example, the roller or the plurality of rollers of the pressing means may be moved circumferentially along the portion of the adhesive tape which is attached to the second annular frame, pressing the portion of the adhesive tape against the second annular frame.

The wafer processing system may further comprise a cleaning means for cleaning the wafer, e.g., after the wafer has been divided.

The wafer processing system may comprise a single wafer processing apparatus or a plurality of, e.g., two or three, wafer processing apparatuses. The plurality of wafer processing apparatuses may be connected to each other.

For example, the wafer processing system may comprise two wafer processing apparatuses, i.e., a first wafer processing apparatus and a second wafer processing apparatus. The first wafer processing apparatus and the second wafer processing apparatus may be connected to each other, e.g., in line. The first wafer processing apparatus may comprise the dividing means, such as a plasma applying means. The second wafer processing apparatus may comprise the support member and the first and second frame holding means. Further, the second wafer processing apparatus may comprise the first moving means and the second moving means. The second wafer processing apparatus may comprise the cleaning means.

The wafer processing system may comprise three or more wafer processing apparatuses connected to each other. One of the wafer processing apparatuses may comprise the support member and the first and second frame holding means. The other wafer processing apparatuses may each comprise a dividing means, such as a plasma applying means. In this case, a single support member and single first and second frame holding means may be used for, i.e., in combination with, a plurality of, e.g., two or three, dividing means, thus significantly reducing the equipment costs.

Alternatively, the wafer processing system may comprise a single wafer processing apparatus which comprises the dividing means, such as a plasma applying means, the support member and the first and second frame holding means. Further, the single wafer processing apparatus may comprise the first moving means and the second moving means. The single wafer processing apparatus may comprise the cleaning means.

The wafer processing system may comprise a control for controlling the components of the system.

The control may be configured to control movement of the first frame holding means and at least a peripheral part of the support member relative to each other in the direction perpendicular to the plane of the support surface, e.g., by controlling the first moving means.

The control may be configured to control movement of the second frame holding means and at least the peripheral part of the support member relative to each other in the direction perpendicular to the plane of the support surface, e.g., by controlling the second moving means.

The control may be configured to control the dividing means so as to divide the wafer along the division lines into the plurality of dies or chips.

For example, the control may be configured to control a mechanical cutting or dicing process of the wafer by controlling a mechanical cutting or dicing means. The control may be configured to control the application of a laser beam to the wafer by controlling a laser beam applying means. The control may be configured to control the application of a plasma to the wafer by controlling a plasma applying means.

The control may be configured to control the wafer processing system so as to carry out the wafer processing method of the invention.

The control may be configured to control the tape cutting means and/or the pressing means and/or the cleaning means.

The wafer processing system may further comprise the first annular frame, wherein the outer diameter of the support member in the plane of the support surface is smaller than an inner diameter of the first annular frame.

The inner diameter of the semiconductor-sized second annular frame is smaller than the inner diameter of the first annular frame.

The wafer processing system may further comprise the semiconductor-sized second annular frame.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a wafer and to wafer processing systems for carrying out these methods.

In the following, a first embodiment of the method of processing a wafer of the present invention and of the wafer processing system of the present invention will be described with reference to FIGS. 1 to 7.

Figure 1:
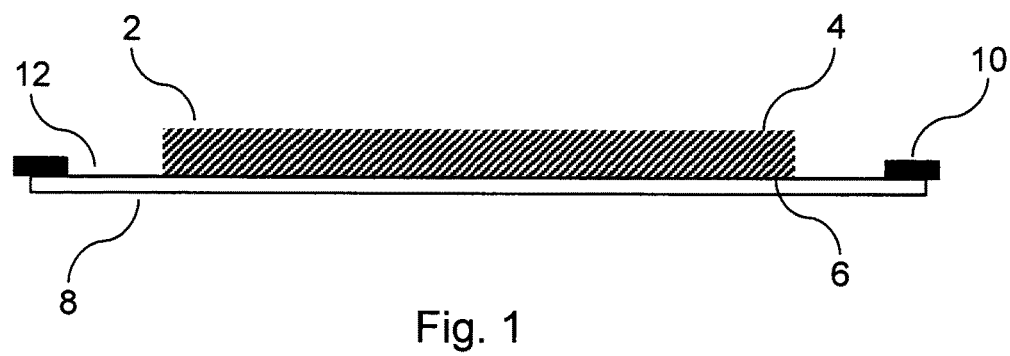
FIG. 1 is a cross-sectional view showing a wafer attached to an adhesive tape supported by a first annular frame.

As is shown in FIG. 1, the wafer 2 to be processed by the method of the invention has a front side 4 and a back side 6 opposite to the front side 4. A device area (not shown) with a plurality of devices partitioned by a plurality of division lines (not shown) is formed on the front side 4 of the wafer 2.

The wafer 2 may be, for example, a semiconductor wafer, a glass wafer, a sapphire wafer, a ceramic wafer, such as an alumina ($Al_2O_3$) ceramic wafer, a silicon oxide ($SiO_2$) wafer, an aluminium nitride (AlN) wafer or the like.

In particular, the wafer 2 may be, for example, a silicon (Si) wafer, a gallium arsenide (GaAs) wafer, a gallium nitride (GaN) wafer, a gallium phosphide (GaP) wafer, an indium arsenide (InAs) wafer, an indium phosphide (InP) wafer, a silicon carbide (SiC) wafer, a silicon nitride (SiN) wafer, a lithium tantalate (LT) wafer, a lithium niobate (LN) wafer or the like.

The devices formed in the device area on the front side 4 of the wafer 2 may be, for example, semiconductor devices, power devices, optical devices, medical devices, electrical components, MEMS devices or combinations thereof.

In the method of the first embodiment, the back side 6 of the wafer 2 is first attached to an adhesive tape 8 supported by a first annular frame 10, so that the wafer 2 is arranged within a central opening 12 of the first annular frame 10. The result of this attachment step is illustrated in FIG. 1.

Subsequently, the wafer 2 attached to the adhesive tape 8 is placed on a support surface 14 of a support member 16, so that the side of the adhesive tape 8 opposite to the side thereof which is attached to the wafer 2 is in contact with the support surface 14 (see FIG. 2). As is illustrated in FIG. 2, the entire wafer 2 attached to the adhesive tape 8 rests directly on the support surface 14 of the support member 16.

Figure 2:
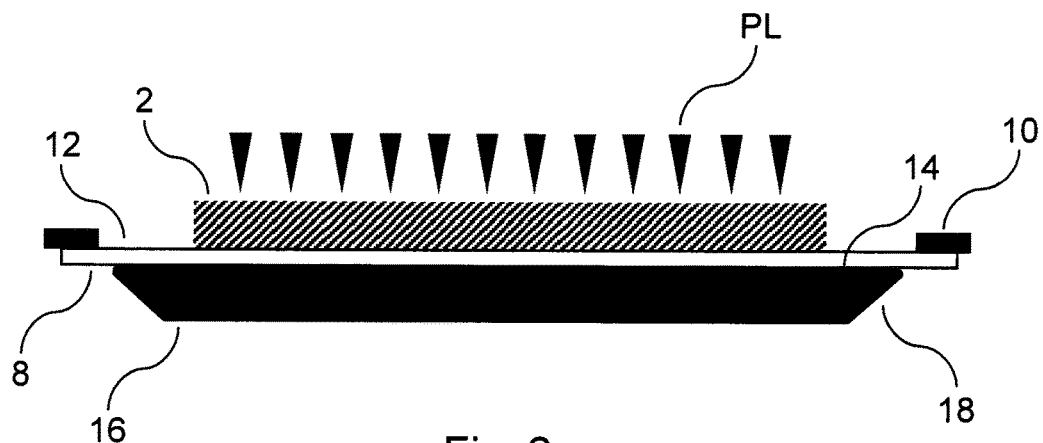
FIG. 2 is a cross-sectional view illustrating a step of applying a plasma to the wafer attached to the adhesive tape according to a first embodiment of the method of the present invention.

The support member 16 shown in FIG. 2 is in the form of a support table having a circular cross-section in the plane of the support surface 14. For example, the support member 16 may be a chuck table. The support member 16 has a continuous support surface 14.

Further, the support member 16 has a chamfered or tapered peripheral portion 18, so that the diameter of the support member 16 decreases with increasing distance from the support surface 14 in the direction perpendicular to the plane of the support surface 14. This chamfered or tapered peripheral portion 18 allows for a particularly good access to the adhesive tape 8 for a cutting tool used in cutting the adhesive tape, as will be explained in further detail with reference to FIG. 6 below.

As is shown in FIG. 2, an outer diameter of the support member 16 in the plane of the support surface 14 is smaller than an inner diameter of the first annular frame 10.

After the wafer 2 attached to the adhesive tape 8 has been placed on the support surface 14 of the support member 16, a plasma PL is applied to the wafer 2 so as to divide the wafer 2 along the division lines, as is illustrated in FIG. 2. The plasma PL is applied to the wafer 2 by a plasma applying means (not shown).

While, in the method of the first embodiment, the wafer 2 is divided along the division lines by applying a plasma PL thereto, alternatively, the wafer 2 may be divided in other ways, for example, by mechanical cutting or dicing and/or by laser cutting or dicing. Also, any combination of mechanical cutting or dicing, laser cutting or dicing and plasma cutting or dicing may be employed for this purpose, as has been explained in detail above.

The support member 16 and the plasma applying means form part of a wafer processing system (not shown) according to a first embodiment of the present invention.

The plasma applying means may be, for example, a plasma chamber, a plasma source, a plasma torch or a plasma nozzle.

The plasma may be applied directly to the wafer 2, i.e., without employing a mask, by means of a plasma beam, for example, using a plasma torch or a plasma nozzle.

Alternatively, a mask may be formed on the wafer front side 4 and, subsequently, the wafer 2 may be subjected to plasma etching, e.g., in a plasma chamber, as has been detailed above.

Figure 3:
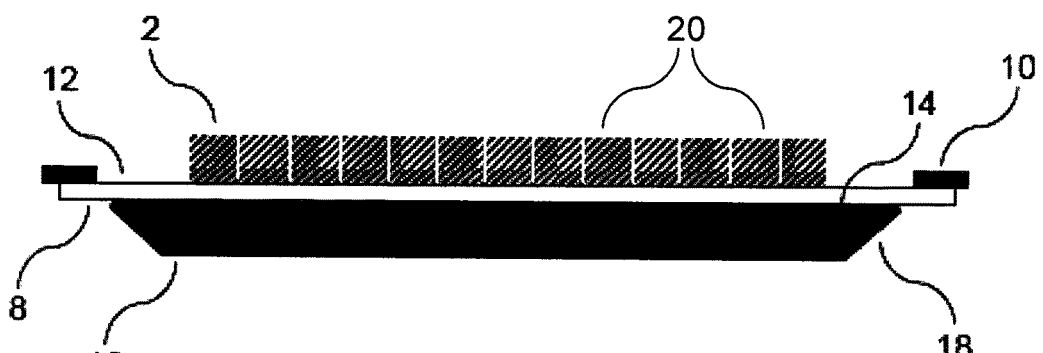
FIG. 3 is a cross-sectional view showing the wafer attached to the adhesive tape after the step of applying the plasma thereto.

The plasma will remove the wafer material along the division lines by plasma etching, thus dividing the wafer 2 into individual dies 20 (see FIG. 3).

The mask may be removed from the separated dies 20 in a subsequent step.

As is schematically shown in FIG. 3, narrow kerfs or cutting grooves are formed between the separated dies 20 in the plasma application step. In order to reliably prevent any damage to the dies 20 due to an unintentional contact therebetween, e.g., when further processing, handling or transporting the divided wafer 2, the distances between the dies 20 are increased, as will be detailed in the following.

Figure 4:
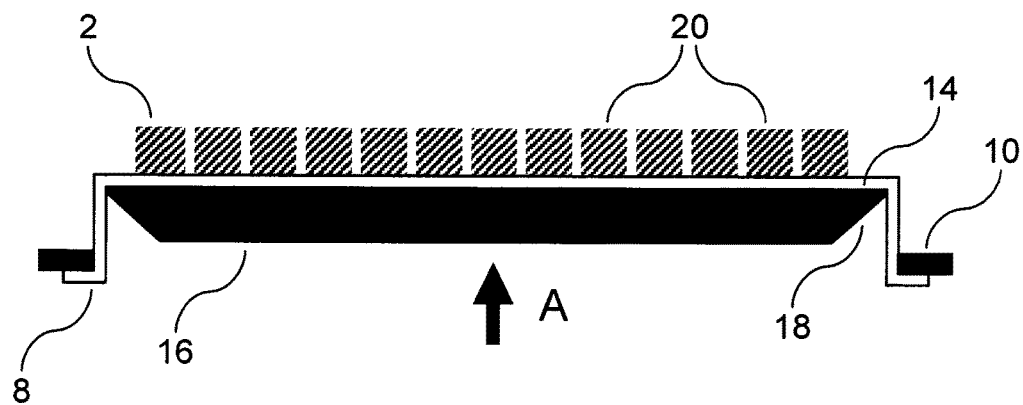
FIG. 4 is a cross-sectional view illustrating a step of radially expanding the adhesive tape according to the first embodiment of the method of the present invention.

After the plasma PL has been applied to the wafer 2, dividing the wafer 2 into the dies 20, the first annular frame 10 and the entire support member 16 are moved relative to each other in the direction perpendicular to the plane of the support surface 14, as is illustrated by an arrow A in FIG. 4. The relative movement between first annular frame 10 and support member 16 may be effected by moving only the first annular frame 10 and keeping the support member 16 stationary, by moving only the support member 16 and keeping the first annular frame 10 stationary, or by moving the first annular frame 10 and the support member 16 relative to each other in opposite directions.

Since the outer diameter of the support member 16 in the plane of the support surface 14 is smaller than the inner diameter of the first annular frame 10, the support member 16 can move through the central opening 12 of the first annular frame 10 in the direction of the arrow A in FIG. 4. Due to this relative movement between first annular frame 10 and support member 16, the adhesive tape 8 is radially expanded in the directions lying in the plane of the support surface 14, thereby moving the dies 20 away from each other (see FIG. 4).

The first annular frame 10 and the support member 16 are moved relative to each other by using a first frame holding means (not shown) and a first moving means (not shown). The first frame holding means holds the first annular frame 10. The first moving means moves the first frame holding means, holding the first annular frame 10, and the support member 16 relative to each other in the direction perpendicular to the plane of the support surface 14.

The first frame holding means and the first moving means form part of the wafer processing system according to the first embodiment of the present invention. The wafer processing system further comprises a control (not shown) configured to control movement of the first frame holding means and the support member 16 relative to each other in the direction perpendicular to the plane of the support surface 14, by controlling the first moving means.

Figure 5:
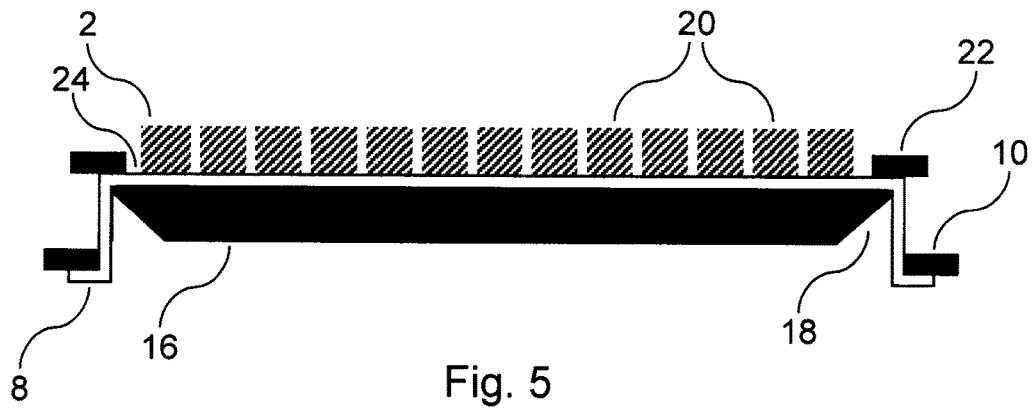
FIG. 5 is a cross-sectional view illustrating a step of attaching a second annular frame to a portion of the expanded adhesive tape according to the first embodiment of the method of the present invention.

Subsequently, a second annular frame 22 is attached to a portion of the expanded adhesive tape 8 arranged at the peripheral part of the support member 16, as is illustrated in FIG. 5. The second annular frame 22 is attached to the side of the adhesive tape 8 which is attached to the wafer 2. The wafer 2, which has been divided into the plurality of dies 20, is arranged within a central opening 24 of the second annular frame 22 (see FIG. 5).

Figure 6:
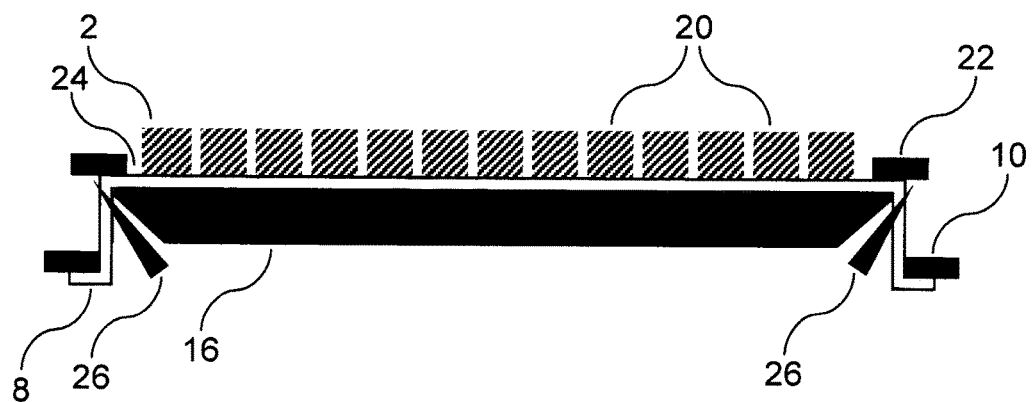
FIG. 6 is a cross-sectional view illustrating a step of circumferentially cutting the adhesive tape according to the first embodiment of the method of the present invention.

By attaching the second annular frame 22 to the peripheral portion of the expanded adhesive tape 8, radial tension of the tape 8 is maintained, thus reliably preventing any damage to the dies 20 due to an unintentional contact therebetween, in particular, after cutting the expanded tape 8 (see FIG. 6).

As is shown in FIG. 5, an inner diameter of the second annular frame 22 is smaller than the outer diameter of the support member 16 in the plane of the support surface 14 and smaller than the inner diameter of the first annular frame 10. Hence, the second annular frame 22 can be attached to the peripheral portion of the expanded adhesive tape 8 in a simple manner, by pressing the second annular frame 22 against the peripheral portion of the support surface 14 with the expanded tape 8 arranged therebetween. In this way, a stable and reliable connection between second annular frame 22 and expanded tape 8 can be efficiently achieved.

The second annular frame 22 is attached to the portion of the expanded adhesive tape 8 arranged at the peripheral part of the support member 16 by using a second frame holding means (not shown) and a second moving means (not shown). The second frame holding means holds the second annular frame 22. The second moving means moves the second frame holding means, holding the second annular frame 22, and the support member 16 relative to each other in the direction perpendicular to the plane of the support surface 14. By moving the second frame holding means and the support member 16 relative to each other in this way, the second annular frame 22 is attached to the portion of the expanded adhesive tape 8 arranged at the peripheral part of the support member 16.

The second frame holding means and the second moving means form part of the wafer processing system according to the first embodiment of the present invention. The control of the wafer processing system is configured to control movement of the second frame holding means and the support member 16 relative to each other in the direction perpendicular to the plane of the support surface 14, by controlling the second moving means.

The second annular frame 22 may be a semiconductor-sized annular frame. In this way, further processing of the wafer 2 after it has been divided, e.g., further processing after storage or shipping thereof, is facilitated, as has been detailed above.

After the second annular frame 22 has been attached to the expanded adhesive tape 8, the adhesive tape 8 is circumferentially cut in a position arranged outside the portion of the adhesive tape 8 which is attached to the second annular frame 22, as is illustrated in FIG. 6. The adhesive tape 8 is circumferentially cut by using a tape cutting means 26, such as a knife or a blade, which is circumferentially moved around the support member 16. As is further shown in FIG. 6, the cutting process is facilitated by the chamfered or tapered peripheral portion 18 of the support member 16 which gives the tape cutting means 26 particularly good access to the adhesive tape 8.

The tape cutting means 26 forms part of the wafer processing system according to the first embodiment of the present invention. The control of the wafer processing system is configured to control the cutting process performed by the tape cutting means 26.

Figure 7:
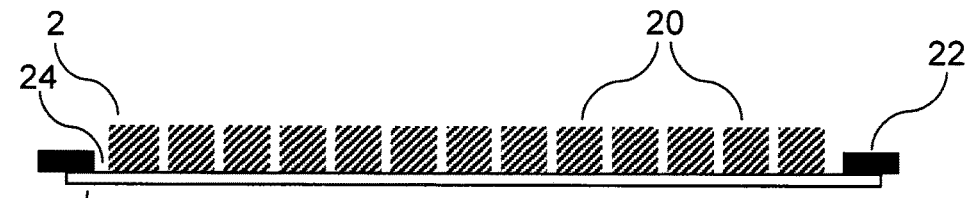
FIG. 7 is a cross-sectional view showing the wafer attached to the adhesive tape supported by the second annular frame after the step of circumferentially cutting the adhesive tape according to the first embodiment of the method of the present invention.

Subsequently, the second annular frame 22 and the divided wafer 2 attached thereto through the adhesive tape 8 are removed from the wafer processing system, as is illustrated in FIG. 7. In this state, the divided wafer 2, which is supported by the second annular frame 22, can be subjected to further processing, stored or shipped. Due to the use of the second annular frame 22, which is attached directly to the peripheral portion of the expanded adhesive tape 8, the tension applied to the expanded tape 8 can be reliably maintained over an extended period of time, e.g., during storage or shipping of the wafer 2.

In the following, a second embodiment of the method of processing a wafer of the present invention and of the wafer processing system of the present invention will be described with reference to FIGS. 8 to 12.

The second embodiment of the invention substantially differs from the first embodiment of the invention in the configuration of the support member 16, as will be detailed below. In the description of the second embodiment, those elements which are substantially identical to those of the first embodiment are denoted by the same reference signs and a repeated description thereof is omitted.

Figure 8:
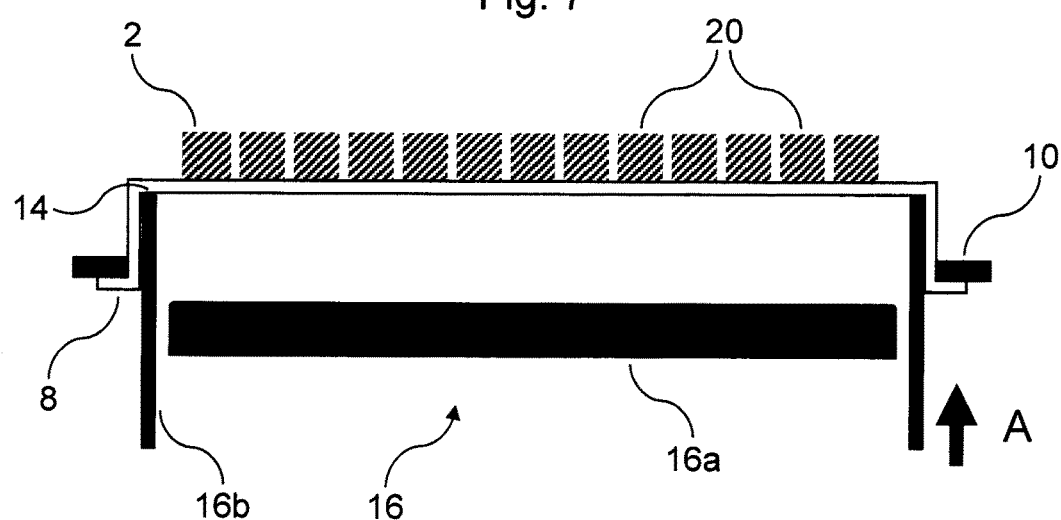
FIG. 8 is a cross-sectional view illustrating a step of radially expanding the adhesive tape according to a second embodiment of the method of the present invention.

As is shown in FIG. 8, the support member 16 according to the second embodiment comprises a central part 16a and an annular peripheral part 16b surrounding the central part 16a. The peripheral part 16b of the support member 16 is movable relative to the central part 16a of the support member 16 in the direction perpendicular to the plane of the support surface 14.

The central part 16a is in the form of a support table, e.g., having a circular cross-section in the plane of the support surface 14. For example, the central part 16a may be in the form of a chuck table. The central part 16a has a continuous support surface.

The peripheral part 16b has an annular cross-section in the plane of the support surface 14. For example, the peripheral part 16b may be in the form of a hollow expansion drum. The peripheral part 16b has a discontinuous support surface.

The steps of attaching the wafer 2 to the adhesive tape 8 supported by the first annular frame 10 and applying the plasma PL to the wafer 2, so as to divide the wafer 2 along the division lines into the dies 20, are substantially the same as for the first embodiment described above.

While, in the method of the second embodiment, the wafer 2 is divided along the division lines by applying a plasma PL thereto, alternatively, the wafer 2 may be divided in other ways, for example, by mechanical cutting or dicing and/or by laser cutting or dicing. Also, any combination of mechanical cutting or dicing, laser cutting or dicing and plasma cutting or dicing may be employed for this purpose, as has been explained in detail above.

After the plasma PL has been applied to the wafer 2, dividing the wafer 2 into the dies 20, the first annular frame 10 and the peripheral part 16b of the support member 16 are moved relative to each other in the direction perpendicular to the plane of the support surface 14, so as to radially expand the adhesive tape 8 in the directions lying in the plane of the support surface 14, thereby moving the dies 20 away from each other, as is illustrated by an arrow A in FIG. 8. Only the peripheral part 16*b* of the support member 16 and the first annular frame 10 may be moved relative to each other. The central part 16*a* of the support member 16 may be kept stationary during the tape expansion process.

Figure 9:
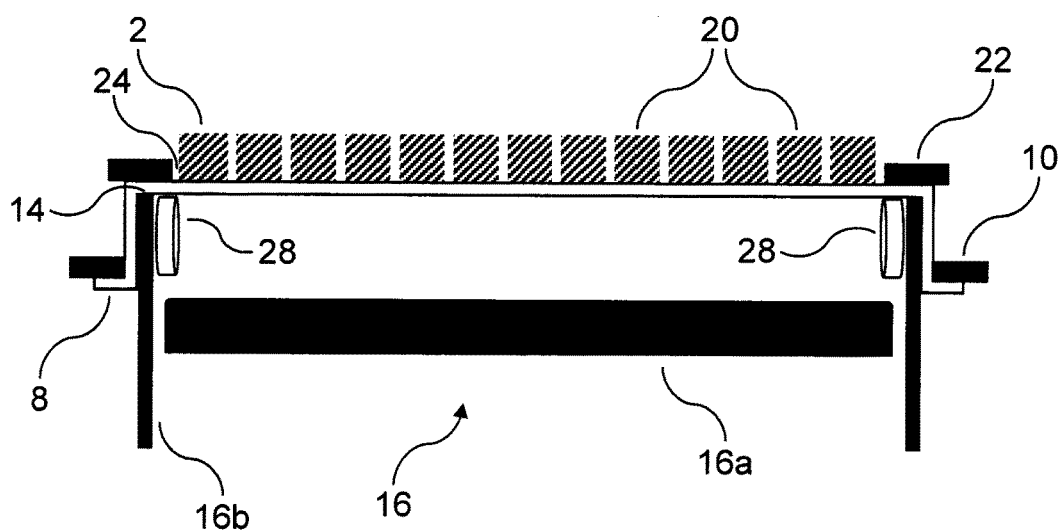
FIG. 9 is a cross-sectional view illustrating a step of attaching a second annular frame to a portion of the expanded adhesive tape and a first step of pressing the portion of the adhesive tape against the second annular frame according to the second embodiment of the method of the present invention.

Subsequently, the second annular frame 22 is attached to a portion of the expanded adhesive tape 8 arranged at the peripheral support member part 16*b*, as is illustrated in FIG. 9. The second annular frame 22 is attached to the side of the adhesive tape 8 which is attached to the wafer 2. The wafer 2, which has been divided into the plurality of dies 20, is arranged within the central opening 24 of the second annular frame 22 (see FIG. 9).

As is shown in FIG. 9, the inner diameter of the second annular frame 22 is smaller than the outer diameter of the support member 16 in the plane of the support surface 14, i.e., the outer diameter of the peripheral part 16*b* of the support member 16, and smaller than the inner diameter of the first annular frame 10. Hence, the second annular frame 22 can be attached to the peripheral portion of the expanded adhesive tape 8 in a simple manner, by pressing the second annular frame 22 against the support surface 14 of the peripheral support member part 16*b* with the expanded tape 8 arranged therebetween. In this way, a stable and reliable connection between second annular frame 22 and expanded tape 8 can be efficiently achieved.

Subsequently, as is also illustrated in FIG. 9, pressure is applied to a radially inner part of the portion of the expanded adhesive tape 8 attached to the second annular frame 22 by using a pressing means 28 comprising a pair of rollers. The rollers of the pressing means 28 are moved circumferentially along the inner part of the portion of the adhesive tape 8 which is attached to the second annular frame 22, pressing this inner part against the second annular frame 22. In this way, the fixation of the adhesive tape 8 to the second annular frame 22 is further improved.

The pressing means 28 forms part of the wafer processing system according to the second embodiment of the present invention. The control of the wafer processing system is configured to control the pressing process performed by the pressing means 28.

Figure 10:
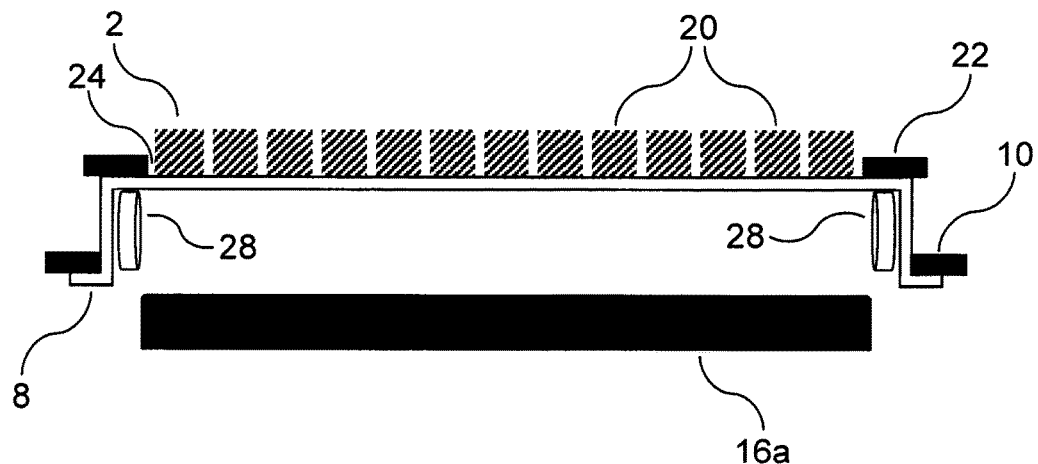
FIG. 10 is a cross-sectional view illustrating a second step of pressing the portion of the adhesive tape against the second annular frame according to the second embodiment of the method of the present invention.

After performing the pressing process on the inner part of the portion of the expanded adhesive tape 8 attached to the second annular frame 22, the peripheral part 16*b* of the support member 16 is retracted and a similar pressing process is carried out on a radially outer part of the portion of the expanded adhesive tape 8 attached to the second annular frame 22 (see FIG. 10). In this way, a particularly homogeneous connection between adhesive tape 8 and second annular frame 22 is achieved. For this additional pressing process, the same pressing means 28 as in the pressing process illustrated in FIG. 9 is used, as is shown in FIG. 10.

Figure 11:
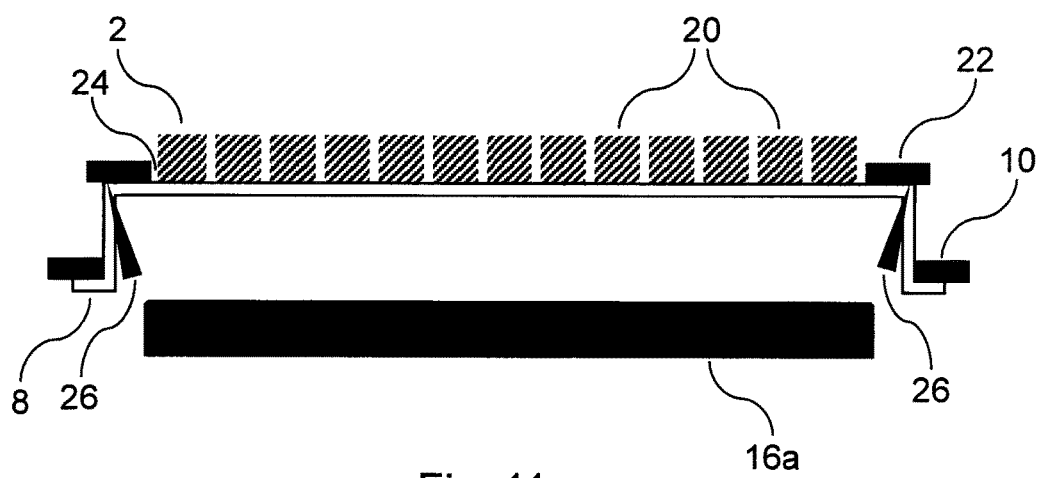
FIG. 11 is a cross-sectional view illustrating a step of circumferentially cutting the adhesive tape according to the second embodiment of the method of the present invention.

Subsequently, as is illustrated in FIG. 11, the adhesive tape 8 is circumferentially cut in a position arranged outside the portion of the adhesive tape 8 which is attached to the second annular frame 22. This cutting process is carried out substantially in the same manner as in the first embodiment (see FIG. 6), using the same tape cutting means 26.

Figure 12:
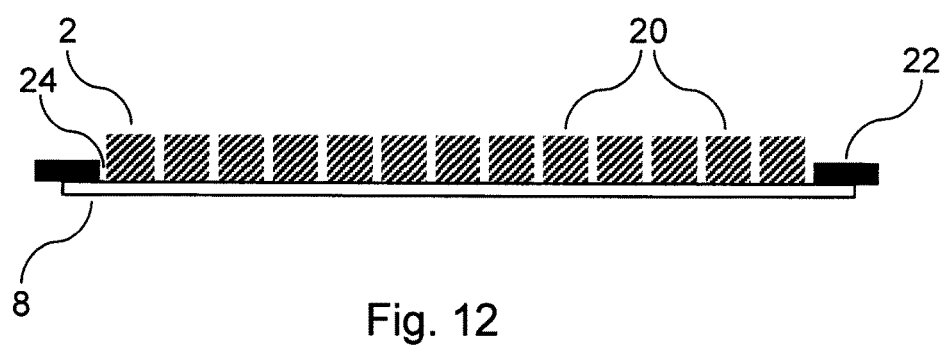
FIG. 12 is a cross-sectional view showing the wafer attached to the adhesive tape supported by the second annular frame after the step of circumferentially cutting the adhesive tape according to the second embodiment of the method of the present invention.

After cutting the adhesive tape 8 in this way, the second annular frame 22 and the divided wafer 2 attached thereto through the adhesive tape 8 are removed from the wafer processing system, as is illustrated in FIG. 12. In this state, the divided wafer 2, which is supported by the second annular frame 22, can be subjected to further processing, stored or shipped. Due to the use of the second annular frame 22, which is attached directly to the peripheral portion of the expanded adhesive tape 8, the tension applied to the expanded tape 8 can be reliably maintained over an extended period of time, e.g., during storage or shipping of the wafer 2.

The invention claimed is:

1. A method of processing a wafer, having on one side a device area with a plurality of devices partitioned by a plurality of division lines, wherein the method comprises:
    attaching the one side of the wafer or the side of the wafer opposite to the one side to an adhesive tape supported by a first annular frame, so that the wafer is arranged within a central opening of the first annular frame;
    dividing the wafer along the division lines into a plurality of dies;
    placing the wafer attached to the adhesive tape on a support surface of a support member before or after dividing the wafer, so that the side of the adhesive tape opposite to the side thereof which is attached to the wafer is in contact with the support surface, wherein an outer diameter of the support member in the plane of the support surface is smaller than an inner diameter of the first annular frame;
    after dividing the wafer moving the first annular frame and at least a peripheral part of the support member relative to each other in the direction perpendicular to the plane of the support surface, so as to radially expand the adhesive tape in the directions lying in the plane of the support surface, thereby moving the dies away from each other; and
    attaching a second annular frame to a portion of the expanded adhesive tape arranged at the peripheral part of the support member, wherein the second annular frame is attached to the side of the adhesive tape which is attached to the wafer and the wafer, which has been divided into the plurality of dies, is arranged within a central opening of the second annular frame; wherein
    an inner diameter of the second annular frame is smaller than the outer diameter of the support member in the plane of the support surface and smaller than the inner diameter of the first annular frame.

2. The method according to claim 1, wherein
    the wafer attached to the adhesive tape is placed on the support surface of the support member before dividing the wafer, and
    the wafer placed on the support surface is divided along the division lines into the plurality of dies.

3. The method according to claim 1, wherein the wafer attached to the adhesive tape is placed on the support surface of the support member after dividing the wafer.

4. The method according to claim 1, wherein the first annular frame and the entire support member are moved relative to each other in the direction perpendicular to the plane of the support surface, so as to radially expand the adhesive tape in the directions lying in the plane of the support surface, thereby moving the dies away from each other.

5. The method according to claim 1, wherein
    the support member comprises a central part a and an annular peripheral part surrounding the central part,
    the peripheral part of the support member is movable relative to the central part of the support member in the direction perpendicular to the plane of the support surface, and
    the first annular frame and the peripheral part of the support member are moved relative to each other in the direction perpendicular to the plane of the support surface, so as to radially expand the adhesive tape in the directions lying in the plane of the support surface, thereby moving the dies away from each other.

6. The method according to claim 1, further comprising, after attaching the second annular frame to the expanded adhesive tape, circumferentially cutting the adhesive tape in a position arranged outside the portion of the adhesive tape which is attached to the second annular frame.

7. The method according to claim 6, further comprising, after cutting the adhesive tape, attaching to the second annular frame a portion of the adhesive tape which is arranged between the position where the adhesive tape had been cut and the portion of the adhesive tape which is attached to the second annular frame.

8. The method according to claim 1, wherein the inner diameter of the second annular frame is smaller than the outer diameter of the support member in the plane of the support surface and/or smaller than the inner diameter of the first annular frame by 20 mm or more.

9. The method according to claim 1, wherein an outer diameter of the first annular frame is substantially the same as an outer diameter of the second annular frame.

10. The method according to claim 1, wherein the second annular frame is a semiconductor-sized annular frame.

11. The method according to claim 1, wherein dividing the wafer along the division lines into the plurality of dies comprises applying a plasma to the wafer.

12. The method according to claim 11, wherein
the method further comprises forming a mask on the side of the wafer opposite to the side thereof which is attached or to be attached to the adhesive tape, after or before attaching the wafer to the adhesive tape and before applying the plasma to the wafer;
the mask is formed so as to leave uncovered the division lines on the one side of the wafer or the regions of the side of the wafer opposite to the one side which lie opposite the division lines; and
the plasma is applied to the wafer on which the mask has been formed.

13. A wafer processing system for processing a wafer, having on one side a device area with a plurality of devices partitioned by a plurality of division lines, wherein the system comprises:
a support member having a support surface for placing the wafer thereon;
a first frame holding means for holding a first annular frame;
a dividing means for dividing the wafer along the division lines into a plurality of dies; and
a second frame holding means for holding a semiconductor-sized second annular frame; wherein
the support member and the first frame holding means are configured so that the first frame holding means and at least a peripheral part of the support member are movable relative to each other in the direction perpendicular to the plane of the support surface,
the support member and the second frame holding means are configured so that the second frame holding means and at least the peripheral part of the support member are movable relative to each other in the direction perpendicular to the plane of the support surface, and
an outer diameter of the support member in the plane of the support surface is larger than an inner diameter of the semiconductor sized second annular frame.

14. The wafer processing system according to claim 13, further comprising the first annular frame, wherein the outer diameter of the support member in the plane of the support surface is smaller than an inner diameter of the first annular frame.

* * * * *